United States Patent
Tapily et al.

(10) Patent No.: US 10,522,343 B2
(45) Date of Patent: Dec. 31, 2019

(54) METHOD OF ENHANCING HIGH-K FILM NUCLEATION RATE AND ELECTRICAL MOBILITY IN A SEMICONDUCTOR DEVICE BY MICROWAVE PLASMA TREATMENT

(71) Applicant: Tokyo Electron Limited, Minato-ku, Tokyo (JP)

(72) Inventors: Kandabara N. Tapily, Mechanicville, NY (US); Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 641 days.

(21) Appl. No.: 14/635,806

(22) Filed: Mar. 2, 2015

(65) Prior Publication Data

US 2015/0249009 A1 Sep. 3, 2015

Related U.S. Application Data

(60) Provisional application No. 61/946,829, filed on Mar. 2, 2014, provisional application No. 61/986,995, filed on May 1, 2014.

(51) Int. Cl.
*H01L 21/02* (2006.01)
*C23C 16/02* (2006.01)
(Continued)

(52) U.S. Cl.
CPC .... *H01L 21/02315* (2013.01); *C23C 16/0272* (2013.01); *C23C 16/405* (2013.01);
(Continued)

(58) Field of Classification Search
CPC ........... H01L 21/02315; H01L 21/0228; H01L 21/02304; H01L 21/02238; H01L 21/02181
(Continued)

(56) References Cited

U.S. PATENT DOCUMENTS

2005/0215034 A1* 9/2005 Vandroux ........... H01L 21/3003
438/475
2006/0172474 A1* 8/2006 Wajda et al. ................. 438/151
(Continued)

FOREIGN PATENT DOCUMENTS

| TW | I220060 B | 8/2004 |
| TW | 200506093 | 2/2005 |
| WO | 01/69665 A1 | 9/2001 |

OTHER PUBLICATIONS

International Searching Authority, International Search Report and Written Opinion issued in corresponding application PCT/US2015/018333 dated Jun. 30, 2015, 13 pp.
(Continued)

*Primary Examiner* — Dzung Tran
(74) *Attorney, Agent, or Firm* — Wood Herron & Evans LLP

(57) ABSTRACT

A method for forming a semiconductor device is provided in several embodiments. According to one embodiment, the method includes providing a substrate in a process chamber, flowing a process gas consisting of hydrogen ($H_2$) and optionally a noble gas into the process chamber, forming plasma excited species from the process gas by a microwave plasma source. The method further includes exposing an interface layer on the substrate to the plasma excited species to form a modified interface layer, and depositing a high dielectric constant (high-k) film by atomic layer deposition (ALD) on the modified interface layer. In some embodiments, the modified interface layer has higher electrical mobility than the interface layer, and the high-k film nucleates at a higher rate on the modified interface layer rate than on the interface layer.

20 Claims, 10 Drawing Sheets

(51) Int. Cl.
*C23C 16/40* (2006.01)
*C23C 16/455* (2006.01)
*H01J 37/32* (2006.01)
*H01L 21/28* (2006.01)
*H01L 29/51* (2006.01)

(52) U.S. Cl.
CPC .. *C23C 16/45525* (2013.01); *H01J 37/32192* (2013.01); *H01J 37/32357* (2013.01); *H01J 37/32449* (2013.01); *H01L 21/0228* (2013.01); *H01L 21/02178* (2013.01); *H01L 21/02181* (2013.01); *H01L 21/02236* (2013.01); *H01L 21/02238* (2013.01); *H01L 21/02252* (2013.01); *H01L 21/02304* (2013.01); *H01L 21/28185* (2013.01); *H01L 21/28194* (2013.01); *H01L 21/28211* (2013.01); *H01L 21/28167* (2013.01); *H01L 29/513* (2013.01); *H01L 29/517* (2013.01); *H01L 29/518* (2013.01)

(58) Field of Classification Search
USPC .................................................. 438/585, 694
See application file for complete search history.

(56) References Cited

U.S. PATENT DOCUMENTS

| | | |
|---|---|---|
| 2006/0189154 A1* | 8/2006 | Ahn et al. ..................... 438/763 |
| 2006/0292872 A1 | 12/2006 | Haukka et al. |
| 2007/0190802 A1* | 8/2007 | Aoyama et al. .............. 438/758 |
| 2009/0047798 A1* | 2/2009 | Clark et al. ................... 438/778 |
| 2009/0163012 A1* | 6/2009 | Clark et al. ................... 438/591 |
| 2010/0075507 A1 | 3/2010 | Chang et al. |
| 2012/0220116 A1 | 8/2012 | Noori et al. |
| 2013/0126986 A1 | 5/2013 | Brodsky et al. |
| 2013/0203230 A1* | 8/2013 | Chen et al. ................... 438/287 |
| 2013/0228735 A1 | 9/2013 | Higuchi et al. |
| 2013/0256812 A1 | 10/2013 | Yao et al. |

OTHER PUBLICATIONS

Taiwanese Patent Office, Office Action in counterpart Taiwanese Patent Application No. 104106451, dated Jun. 6, 2016.

* cited by examiner

METHOD OF ENHANCING HIGH-K FILM NUCLEATION RATE AND ELECTRICAL MOBILITY IN A SEMICONDUCTOR DEVICE BY MICROWAVE PLASMA TREATMENT

CROSS-REFERENCE TO RELATED APPLICATIONS

This application is related to and claims priority to U.S. Provisional application Ser. No. 61/946,829 filed on Mar. 2, 2014, the entire contents of which are herein incorporated by reference. This application is related to and claims priority to U.S. Provisional application Ser. No. 61/986,995 filed on May 1, 2014, the entire contents of which are herein incorporated by reference.

FIELD OF THE INVENTION

The present invention generally relates to a method of enhancing high-dielectric constant (high-k) film nucleation rate and electrical mobility in a semiconductor device by microwave plasma treatment of an interface layer on a substrate prior to deposition of a high-k film on the interface layer.

BACKGROUND OF THE INVENTION

Devices with a high-mobility channel, such as Si, SiGe, Ge and compound semiconductors offer the possibility of increased device performance beyond traditional Si-based devices. In particular, Ge and Ge-containing materials are attractive candidates due to lower effective mass and higher mobility for charge carriers compared to Si. However, one of the issues with the high mobility channel is the poor oxide and interface quality that can result in device degradation.

$HfO_2$-based dielectrics have successfully replace $SiO_2$ in the state of art CMOS technology. However, in order to continue the further scaling of the $HfO_2$-based gate dielectric and other high-k dielectrics, it is necessary to scale the equivalent oxide thickness (EOT) by scaling the overall dielectric thickness, including the thickness of the interface layer.

SUMMARY OF THE INVENTION

A method is provided for forming a semiconductor device. According to one embodiment, the method includes providing a substrate in a process chamber, flowing a process gas consisting of hydrogen ($H_2$) and optionally a noble gas into the process chamber, and forming plasma excited species from the process gas by a microwave plasma source. The method further includes exposing an interface layer on the substrate to the plasma excited species to form a modified interface layer, and depositing a high dielectric constant (high-k) film by atomic layer deposition (ALD) on the modified interface layer.

According to another embodiment, the method includes providing a substrate in a process chamber, flowing a process gas consisting of $H_2$ and optionally a noble gas into the process chamber, and forming plasma excited species from the process gas by a microwave plasma source. The method further includes exposing an interface layer on the substrate to the plasma excited species to form a modified interface layer with increased electrical mobility, where the exposing reduces a thickness of the interface layer, and depositing a high-k film by ALD on the modified interface layer, where the high-k film nucleates at a higher rate on the modified interface layer rate than on the interface layer.

According to yet another embodiment, the method includes providing a germanium-containing substrate in a process chamber, flowing a process gas consisting of $H_2$ and optionally a noble gas into the process chamber, and forming plasma excited species from the process gas by a microwave plasma source. The method further includes exposing a germanium-containing interface layer on the substrate to the plasma excited species to form a modified germanium-containing interface layer with increased electrical mobility, and depositing a high-k film by ALD on the modified germanium-containing interface layer, where the high-k film nucleates at a higher rate on the modified germanium-containing interface layer rate than on the germanium-containing interface layer.

DETAILED DESCRIPTION OF SEVERAL EMBODIMENTS

Embodiments of the invention are described below in reference to the Figures. According to one embodiment, a method is provided for forming a semiconductor device. The method uses microwave plasma treatment to enhance high-k film nucleation rate and electrical mobility in the semiconductor device.

According to one embodiment, the method includes providing a substrate in a process chamber, flowing a process gas consisting of $H_2$ and optionally a noble gas into the process chamber, and forming plasma excited species from the process gas by a microwave plasma source. The method further includes exposing an interface layer on the substrate to the plasma excited species to form a modified interface layer with increased electrical mobility, and depositing a high-k film on the modified interface layer. The exposure of the interface layer to plasma excited species can reduce the thickness of the interface layer and the modified interface layer has been found to be more reactive than the original unmodified interface layer. The more reactive interface layer provides improved nucleation during ALD of a high-k film on the modified interface layer. In addition to increased ALD deposition rate, and thus higher manufacturing throughput, the high-k film has the superior material and electronic properties needed for advanced semiconductor devices, including scaled CMOS devices.

Figure 1:
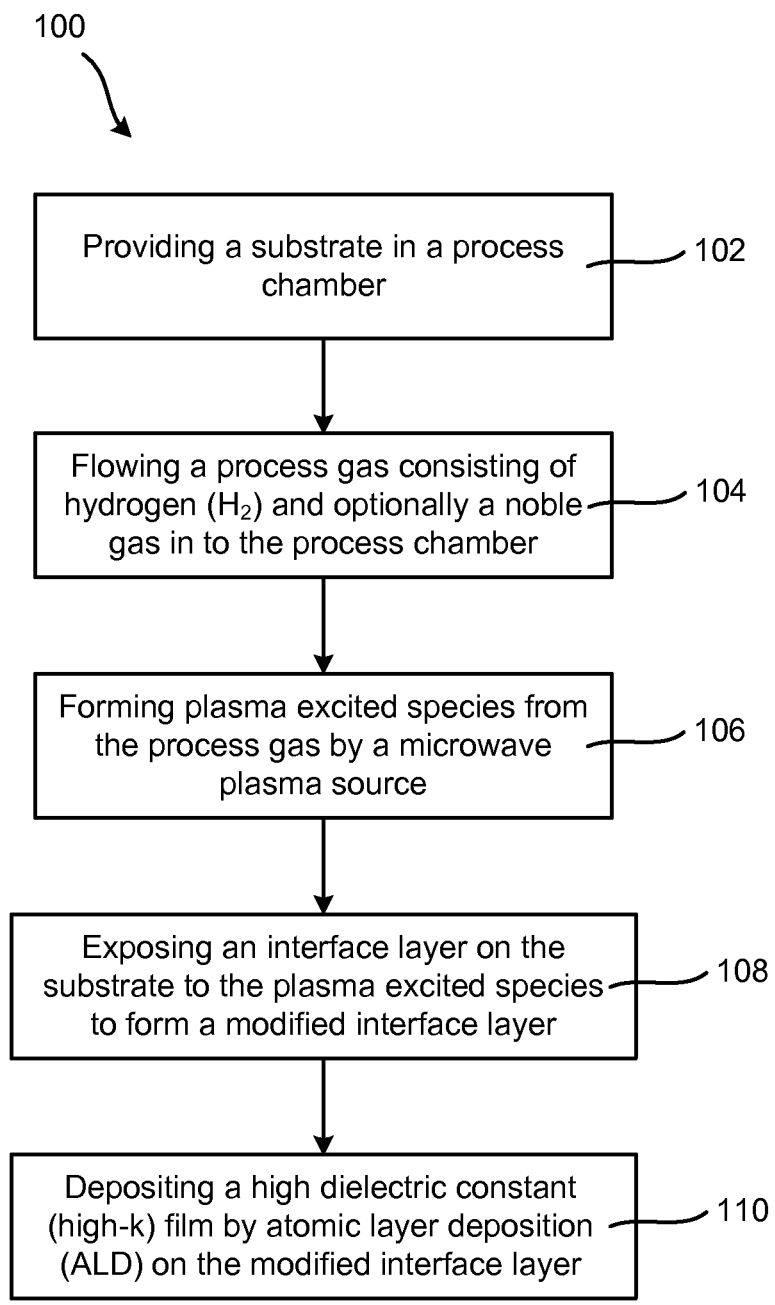
FIG. 1 is a process flow diagram for forming a semiconductor device according to an embodiment of the invention.

FIG. 1 is a process flow diagram 100 for forming a semiconductor device and FIGS. 2A through 2E schematically illustrate through cross-sectional views a method for forming a semiconductor device according to an embodiment of the invention. The process flow diagram 100 includes, in 102, providing a substrate 200 in a process chamber. The substrate 200 can, for example, include silicon, germanium, silicon germanium, or compound semiconductors. According to one embodiment, the substrate 200 may contain a germanium-containing substrate, for example Ge or SiGe.

Figure 2A:
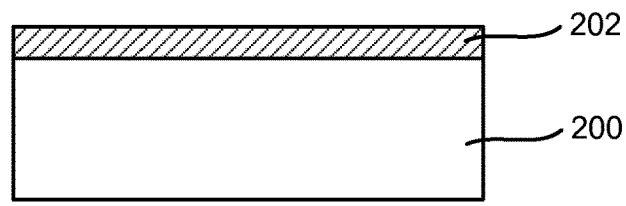
FIGS. 2A through 2E schematically illustrate through cross-sectional views a method for forming a semiconductor device according to an embodiment of the invention.
Figure 2B:
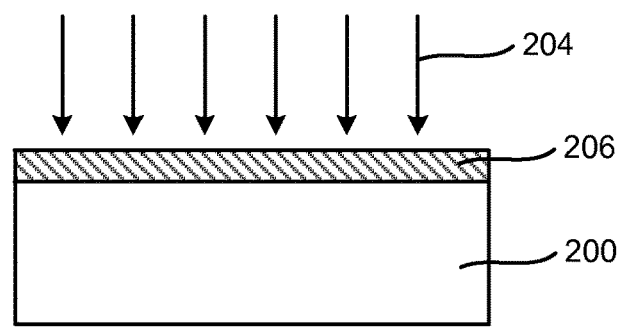
Figure 2C:
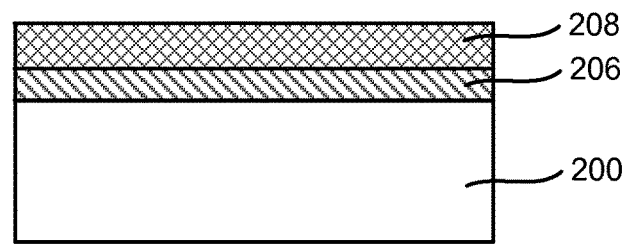
Figure 2D:
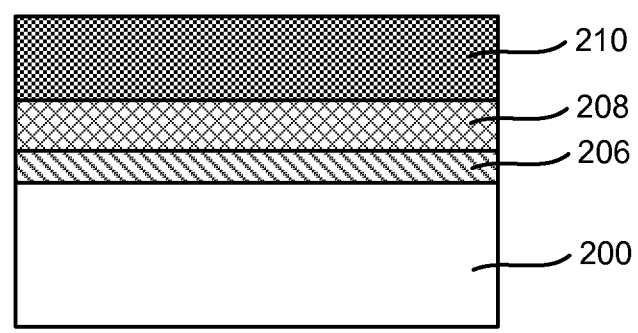
Figure 2E:
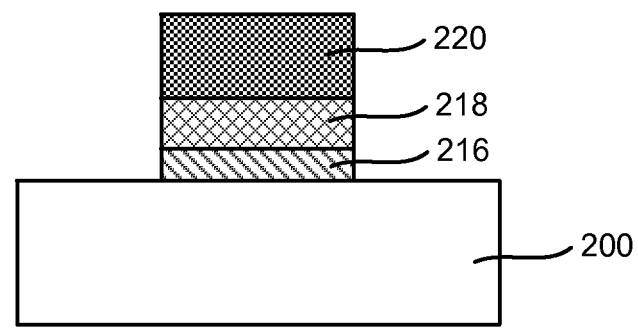

As depicted in FIG. 2A, the substrate 200 can have an interface layer 202 formed thereon. The interface layer 202 can, for example, include an oxide layer, an oxynitride layer, or a nitride layer, or a combination thereof. Examples include $SiO_2$, SiON, and SiN. In the case of a germanium-containing substrate 200, the germanium-containing interface layer can include germanium oxide ($GeO_x$).

In one example, the interface layer 202 may be formed or deposited on the substrate 200 in the process chamber prior to exposing the substrate 200 to the plasma excited species. According to one embodiment, the substrate 200 is not exposed to air between the time the substrate 200 is introduced into the process chamber and when the substrate 200 is exposed to the plasma excited species.

In one example, the interface layer 202 may be formed by exposing a clean substrate 200 to alternating pulses of ozone and water. In another example, the interface layer may be formed by exposing the substrate to plasma exited species formed by microwave plasma excitation of an oxygen-containing gas. The oxygen-containing gas can contain $O_2$ and optionally a noble gas. The interface layer 202 may be formed using a substrate temperature between about 20° C. and about 500° C., between about 20° C. and about 300° C., between about 20° C. and about 200° C., between about 20° C. and about 100° C., between about 100° C. and about 500° C., between about 200° C. and about 500° C., between about 300° C. and about 500° C., between about 20° C. and about 500° C., or between about 200° C. and about 300° C. In one example, the substrate temperature can be about 250° C.

When forming the interface layer 202 by exposing the substrate 200 to plasma exited species formed by microwave plasma excitation of $O_2$ and Ar, the Ar gas flow rate can be between about 100 sccm and about 5000 sccm, between about 100 sccm and about 2000 sccm, between about 100 sccm and about 1000 sccm, between about 100 sccm and about 500 sccm, between about 3000 sccm and about 5000 sccm, between about 2000 sccm and about 5000 sccm, or between about 1000 sccm and about 5000 sccm. An $O_2$ gas flow rate can be between about 1 sccm and about 50 sccm, between about 1 sccm and about 30 sccm, between about 1 sccm and about 20 sccm, between about 1 sccm and about 10 sccm, between about 5 sccm and about 50 sccm, between about 10 sccm and about 50 sccm, or between about 20 sccm and about 50 sccm.

In other examples, the interface layer 202 may be formed by $H_2O_2$ oxidation, wet (liquid) chemical oxidation, or in-situ steam growth (ISSG).

According to one embodiment, an initial oxide layer (e.g., a native oxide layer) may be removed from the substrate 200 in the process chamber or outside the process chamber prior to forming the interface layer 202 on the substrate in the process chamber. The initial oxide layer may be removed by a chemical oxide removal (COR) process or by exposure to wet dilute hydrofluoric acid (DHF). Thus, after removal of an initial oxide layer, a surface of the substrate 200 provided in the process chamber may be at least substantially free of oxygen.

In one example, a substrate 200 containing an initial oxide layer is introduced into the process chamber, the initial oxide layer is removed from the substrate in the process chamber, thereafter an interface layer 202 is formed on the substrate in the process chamber, and thereafter the interface layer 202 is exposed to the plasma excited species to form a modified interface layer on the substrate.

In another example, a substrate containing an initial oxide layer is introduced into an auxiliary process chamber (e.g., a chamber configured for performing a chemical oxide removal (COR) process, the initial oxide layer is removed from the substrate in the auxiliary process chamber, thereafter an interface layer is formed on the substrate in the process chamber, and thereafter the interface layer is exposed to the plasma excited species in the process chamber to form a modified interface layer on the substrate.

In 104, the method further includes flowing a process gas consisting of hydrogen ($H_2$) gas and optionally a noble gas (e.g., He or Ar) into the process chamber. Exemplary processing conditions include a process gas containing $H_2$ and Ar. An Ar gas flow rate can be between about 100 sccm and about 5000 sccm, between about 100 sccm and about 2000 sccm, between about 100 sccm and about 1000 sccm, between about 100 sccm and about 500 sccm, between about 3000 sccm and about 5000 sccm, between about 2000 sccm and about 5000 sccm, or between about 1000 sccm and about 5000 sccm. A $H_2$ gas flow rate can be between about 10 sccm and about 500 sccm, between about 10 sccm and about 300 sccm, between about 10 sccm and about 200 sccm, between about 10 sccm and about 100 sccm, between about 50 sccm and about 500 sccm, between about 100 sccm and about 500 sccm, or between about 200 sccm and about 500 sccm. In one example, the Ar gas flow can be about 2000 sccm and the $H_2$ gas flow can be about 100 sccm. The substrate temperature can be between about 20° C. and about 500° C., between about 20° C. and about 300° C., between about 20° C. and about 200° C., between about 20° C. and about 100° C., between about 100° C. and about 500° C., between about 200° C. and about 500° C., between about 300° C. and about 500° C., between about 20° C. and about 500° C., or between about 200° C. and about 300° C. In one example, the substrate temperature can be about 250° C.

In 106, the method further includes forming plasma excited species from the process gas by a microwave plasma source. Exemplary plasma processing systems containing a microwave plasma source are described in FIGS. 10-13.

In 108, the method further includes exposing the interface layer 202 on the substrate 200 to the plasma excited species 204 to form a modified interface layer 206. In one example, exposing the interface layer 202 to the plasma excited species increases the electrical mobility of the interface layer 202, reduces a thickness of the interface layer 202, and forms a modified interface layer 206 with improved nucleation characteristics for ALD of a high-k film on the modified interface layer 206.

In 110, the method further includes depositing a high-k film 208 by ALD on the modified interface layer 206. In one example, the ALD process may be performed in the same process chamber that was used to form the modified interface layer 206. The ALD process can include alternating exposures of a metal-containing precursor and an oxygen-containing gas.

The high-k film 208 can contain one or more metal elements selected from alkaline earth elements, rare earth elements, Group IIIA and Group IVB elements of the Periodic Table of the Elements. The high-k material can include oxides, oxynitrides, or nitrides of those elements. Alkaline earth metal elements include beryllium (Be), magnesium (Mg), calcium (Ca), strontium (Sr), and barium (Ba). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other high-k materials are contemplated and may be used.

Representative examples of Group IVB metal-containing precursors include: $Hf(O^tBu)_4$ (hafnium tert-butoxide, HTB), $Hf(NEt_2)_4$ (tetrakis(diethylamido)hafnium, TDEAHf), $Hf(NEtMe)_4$ (tetrakis(ethylmethylamido)hafnium, TEMAHf), $Hf(NMe_2)_4$ (tetrakis(dimethylamido)hafnium, TDMAHf), $Zr(O^tBu)_4$ (zirconium tert-butoxide, ZTB), $Zr(NEt_2)_4$ (tetrakis(diethylamido)zirconium, TDEAZr), $Zr(NMeEt)_4$ (tetrakis(ethylmethylamido)zirconium, TEMAZ), $Zr(NMe_2)_4$ (tetrakis(dimethylamido)zirconium, TDMAZr), $Hf(mmp)_4$, $Zr(mmp)_4$, $Ti(mmp)_4$, $HfCl_4$, $ZrCl_4$, $TiCl_4$, $Ti(NiPr_2)_4$, $Ti(NiPr_2)_3$, tris(N,N'-dimethylacetamidinato)titanium, $ZrCp_2Me_2$, $Zr(tBuCp)_2Me_2$, $Zr(NiPr_2)_4$, $Ti(OiPr)_4$, $Ti(O^tBu)_4$ (titanium tert-butoxide, TTB), $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), and $Ti(THD)_3$ (tris(2,2,6,6-tetramethyl-3,5-heptanedionato)titanium).

In some examples, the high-k film 208 can be a bilayer containing a 1) diffusion barrier such as $Al_2O_3$, SiN, or AlN, and 2) $HfO_2$, $ZrO_2$, $TiO_2$, $La_2O_3$, or $Gd_2O_3$.

After forming a high-k film 208 on the modified interface layer 206, the substrate 200 may be further processed, for example by depositing a metal-containing gate electrode film 210 on the high-k film 208, and forming a gate stack by patterning the metal-containing gate electrode film 210, the high-k film 208, and the modified interface layer 206. The gate stack depicted in FIG. 2E contains a patterned metal-containing gate electrode film 220, a patterned high-k film 218, and a patterned modified interface layer 216.

Figure 3:
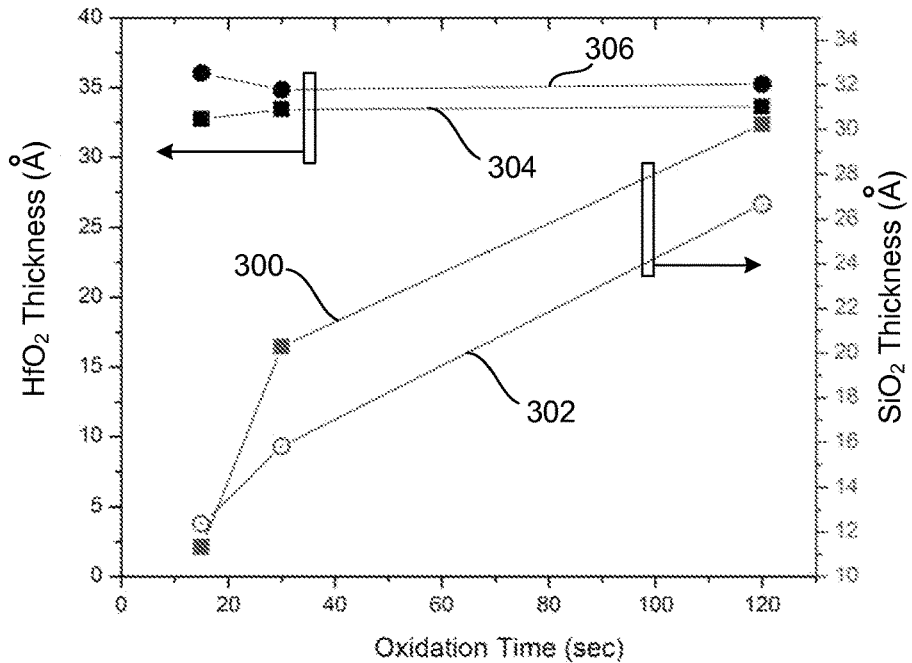
FIG. 3 shows $HfO_2$ thickness and $SiO_2$ interface layer thickness as a function of oxidation time.

FIG. 3 shows $HfO_2$ thickness and $SiO_2$ interface layer thickness as a function of oxidation time. The thicknesses were measured ex-situ by XPS. The oxidation time refers to exposure of the Si substrate to microwave plasma excited $O_2$ species to form the $SiO_2$ interface layer. The oxidation times were 15 seconds, 30 seconds, and 120 seconds. Trace 300 shows $SiO_2$ thickness formed by exposing a Si substrate to microwave plasma excited $O_2$ species. Trace 302 shows $SiO_2$ thickness formed by exposing a Si substrate to microwave plasma excited $O_2$ species and, thereafter, modifying the $SiO_2$ by exposure to microwave plasma excited $H_2$ species. Trace 304 shows $HfO_2$ thickness deposited by ALD on a $SiO_2$ interface layer formed by exposure to microwave plasma excited $O_2$ species. Trace 306 shows $HfO_2$ thickness deposited by ALD on a $SiO_2$ interface layer formed by exposure to microwave plasma excited $O_2$ species and thereafter modified by exposure to microwave plasma excited $H_2$ species. The $HfO_2$ films were deposited by 40 alternating exposures of a hafnium precursor (tetrakis(ethylmethylamino)hafnium; TEMAHf) and water vapor at a substrate temperature of 250° C. The $H_2$ microwave plasma excitation was performed for 90 seconds at a chamber pressure of 90 mTorr and substrate temperature of 250° C.

FIG. 3 shows that the thickness of the modified $SiO_2$ interface layer is less than the thickness of the unmodified $SiO_2$ interface layer (about 5 Angstrom reduction for thick $SiO_2$ interface layers), and the thickness of the $HfO_2$ film is greater on modified $SiO_2$ interface layers compared to on unmodified $SiO_2$ interface layers. These results are due to thinning of the $SiO_2$ interface layer by the exposure to $H_2$ gas excited by the microwave plasma source, and improved nucleation of $HfO_2$ formed by ALD on the modified $SiO_2$ interface layer.

Figure 4:
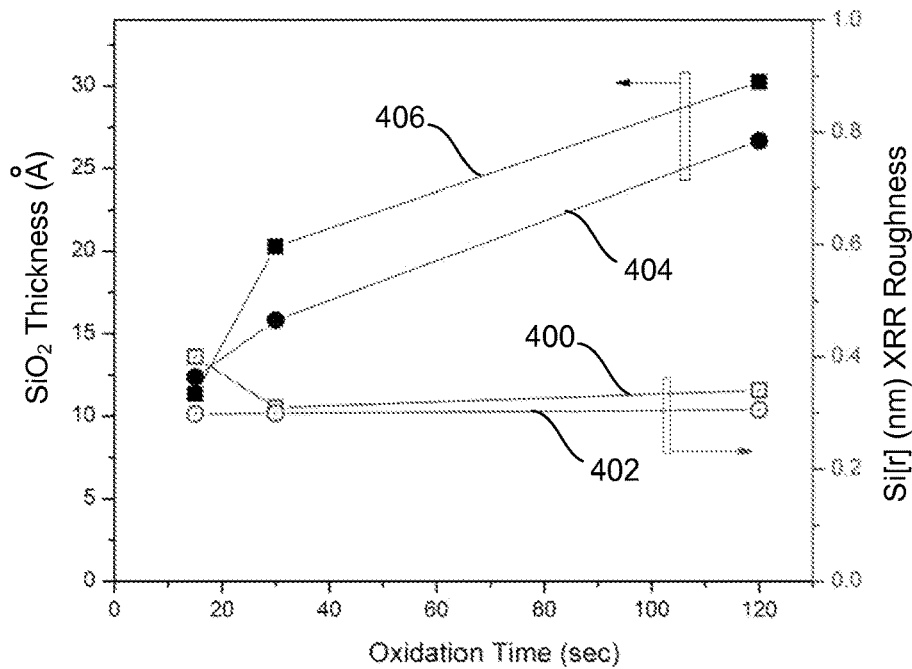
FIG. 4 shows $SiO_2$ interface layer thickness measured ex-situ by XPS and interface layer roughness measured by X-ray reflectivity (XRR) as a function of oxidation time.

FIG. 4 shows $SiO_2$ interface layer thickness measured ex-situ by XPS and interface layer roughness measured by X-ray reflectivity (XRR) as a function of oxidation time. Trace 400 shows film roughness for a $SiO_2$ interface layer formed by exposing a Si substrate to microwave plasma excited $O_2$ species. Trace 402 shows film roughness for a $SiO_2$ interface layer formed by exposing a Si substrate to microwave plasma excited $O_2$ species and, thereafter, modifying the $SiO_2$ interface layer by exposure to microwave plasma excited $H_2$ species. Trace 406 shows $SiO_2$ thickness formed by exposing a Si substrate to microwave plasma excited $O_2$ species. Trace 404 shows $SiO_2$ thickness formed by exposing a Si substrate to microwave plasma excited $O_2$ species and, thereafter, modifying the $SiO_2$ by exposure to microwave plasma excited $H_2$ species. The results in FIG. 4 show that no significant increase (degradation) in the roughness of the $SiO_2$ interface layer is observed following the exposure to microwave plasma excited $H_2$.

Figure 5:
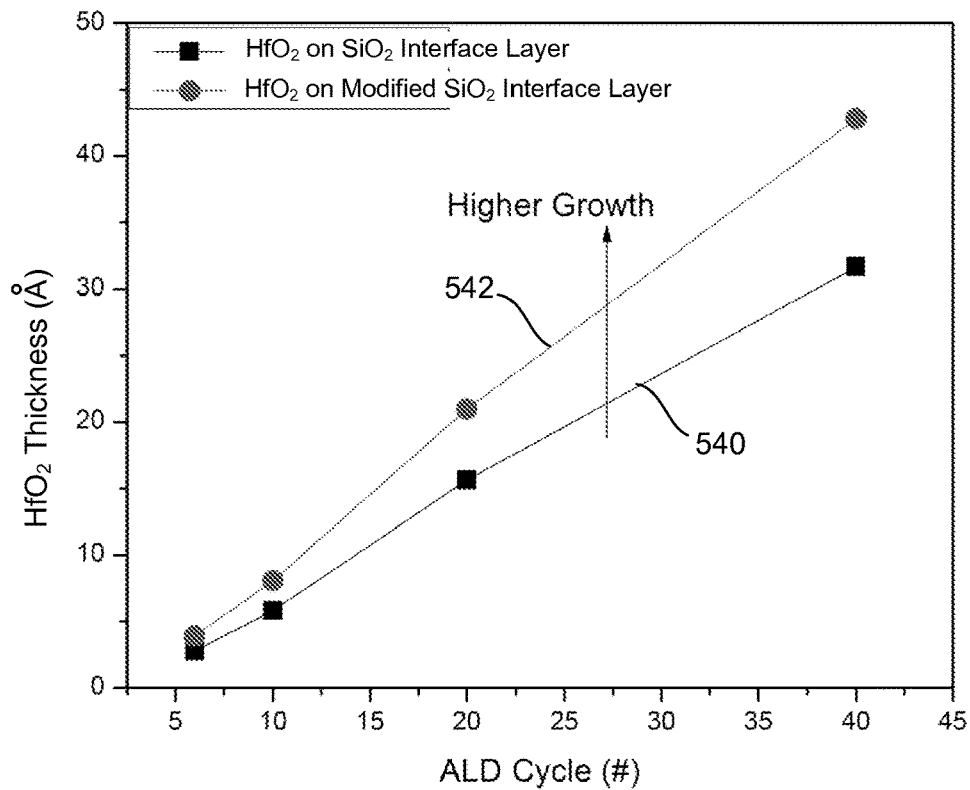
FIG. 5 shows $HfO_2$ thickness deposited on a $SiO_2$ interface layer versus deposited on a modified $SiO_2$ interface layer as a function of number of ALD cycles.

FIG. 5 shows $HfO_2$ thickness deposited on a $SiO_2$ interface layer versus deposited on a modified $SiO_2$ interface layer as a function of number of ALD cycles. The deposition rate (growth rate) of $HfO_2$ was higher on the modified $SiO_2$ interface layer (trace 542) than on the $SiO_2$ interface layer (trace 540), indicating better nucleation of the $HfO_2$ on the modified interface layer. The process flow included forming a chemical oxide film on the substrate by a wet process, removing the chemical oxide film in a process chamber using a chemical oxide removal process, forming an $SiO_2$ interface layer on the substrate by sequential ozone ($O_3$) and water ($H_2O$) exposures in the process chamber, modifying the $SiO_2$ interface layer by exposure to microwave plasma excited $H_2$, depositing $HfO_2$ by ALD on the modified $SiO_2$ interface layer, and measuring the $HfO_2$ thickness ex-situ using XPS. The sequential ozone and water exposures included 2 pulses of ozone followed by 10 pulses of water, with pumping and purging between each pulse.

Figure 6:
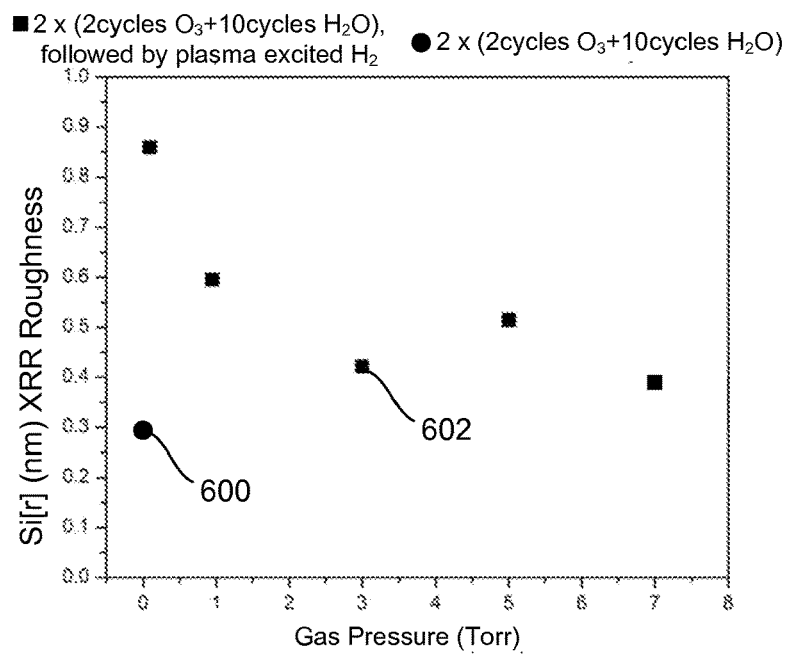
FIG. 6 shows $SiO_2$ interface layer roughness as a function of gas pressure used during exposure of the $SiO_2$ interface layer to microwave plasma excited $H_2$.

FIG. 6 shows $SiO_2$ interface layer roughness as a function of gas pressure used during exposure of the $SiO_2$ interface layer to microwave plasma excited $H_2$. Substrates containing a SiO₂ interface layer were prepared and some were exposed to microwave excited $H_2$ species at different gas pressures in the process chamber. The $SiO_2$ interface layers were prepared by performing the following process twice: sequential ozone and water exposures that included 2 pulses of ozone followed by 10 pulses of water, with pumping and purging between each pulse.

FIG. 6 shows that increasing the gas pressure reduced the roughness of the modified $SiO_2$ interface layer (602, solid squares). Increasing the gas pressure to about 3 Torr, or greater, reduced the roughness of the modified $SiO_2$ interface layer to approximately the same roughness as unmodified $SiO_2$ interface layer (600). This decrease in roughness is likely due to reduced amount of microwave excited $H_2$ species that reach the substrate with increasing gas pressure, since the excited $H_2$ species are thought increase the roughness of the modified $SiO_2$ interface layer. However, a reduced amount of excited $H_2$ species also reduces the nucleation enhancement on the modified interface layer.

Figure 7:
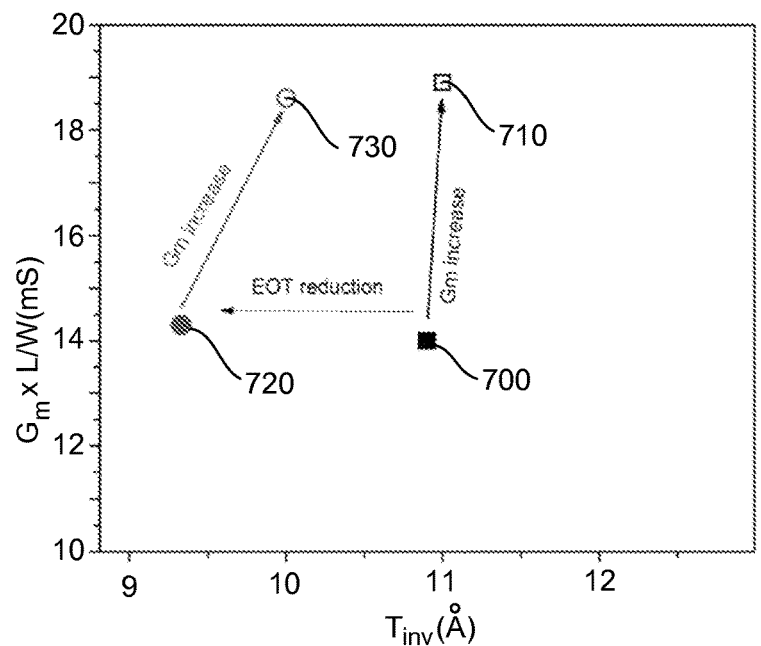
FIG. 7 shows measured transconductance ($G_m \times L/W$) as a function of inversion oxide thickness ($T_{inv}$) for four different test samples.

FIG. 7 shows measured transconductance ($G_m \times L/W$) as a function of inversion oxide thickness ($T_{inv}$) for four different test samples. Transconductance is a measure of electric mobility in semiconductor devices. The test samples included a germanium (Ge) substrate, an unmodified and a modified germanium oxide interface layer on the Ge substrate, an $Al_2O_3$ high-k layer deposited by ALD on the unmodified and modified germanium oxide interface layers, and a $ZrO_2$ high-k layer deposited by ALD on the $Al_2O_3$ high-k layer. A thickness of the $Al_2O_3$ layer was about 3 Angstrom, and a thickness of the $ZrO_2$ layer was about 30 Angstrom. The interface layers for the test samples were prepared as follows: 700) a clean Ge substrate was oxidized using microwave plasma excited $O_2$ species; 710) the interface layer in 700 was modified by exposure to microwave plasma excited $H_2$ species; 720) a clean Ge substrate was oxidized using sequential ozone ($O_3$) and water ($H_2O$) exposures (6 sequential ozone gas pulses followed by 10 sequential water pulses); and 730) the interface layer in 720 was modified by exposure to microwave plasma excited $H_2$ species.

FIG. 7 shows that the transconductance was greatly enhanced for both test samples 700 and 720 when they were modified by exposure to microwave plasma excited $H_2$ species. Further, the inversion oxide thickness, and thus the effective oxide thickness (EOT), was lower for the interface layers 720 and 730 than the interface layers 700 and 710. It is contemplated that the exposure to microwave plasma excited $H_2$ species makes the interface layer more reactive while also lowering the surface roughness and surface defects. This can increase the hole and/or electron mobility of the interface layer and the resulting semiconductor device.

Figure 8:
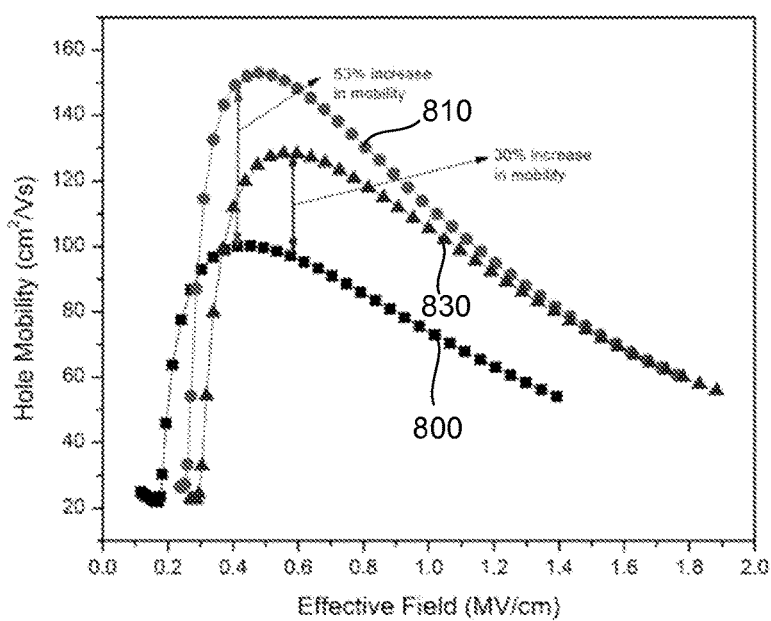
FIG. 8 shows measured hole mobility as a function of effective field.

FIG. 8 shows measured hole mobility as a function of effective field. The test samples 800, 810, and 830, were the same as the test samples 700, 710, and 730, respectively in FIG. 7. FIG. 8 shows a 53% increase in mobility between samples 800 and 810, and 30% increase in mobility between samples 800 and 830.

Figure 9:
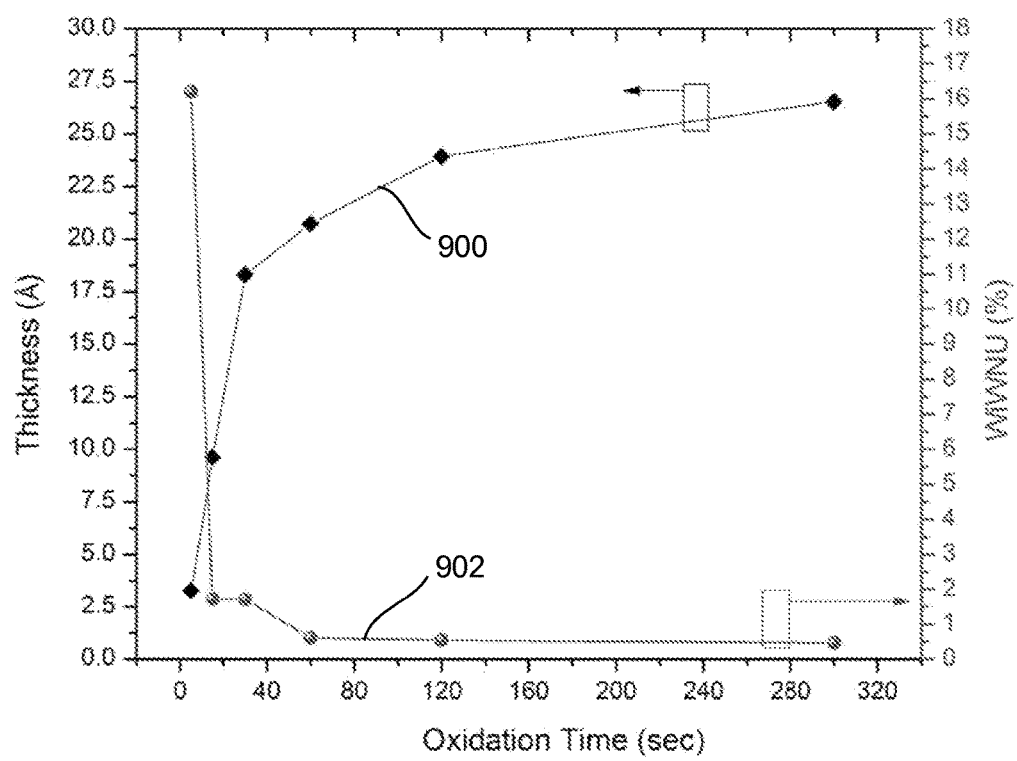
FIG. 9 shows germanium oxide thickness and thickness uniformity as a function of microwave plasma oxidation time.

FIG. 9 shows germanium oxide thickness and thickness uniformity as a function of microwave plasma oxidation time. The oxidation was done at low substrate temperature, below 400° C. Very good control over oxidation of Ge by microwave plasma using $O_2$ gas is observed with good control over the oxide thickness 900 under 1 nm, and the with-in-wafer non-uniformity (WiWNU) 902 was around or below 1%.

Figure 10:
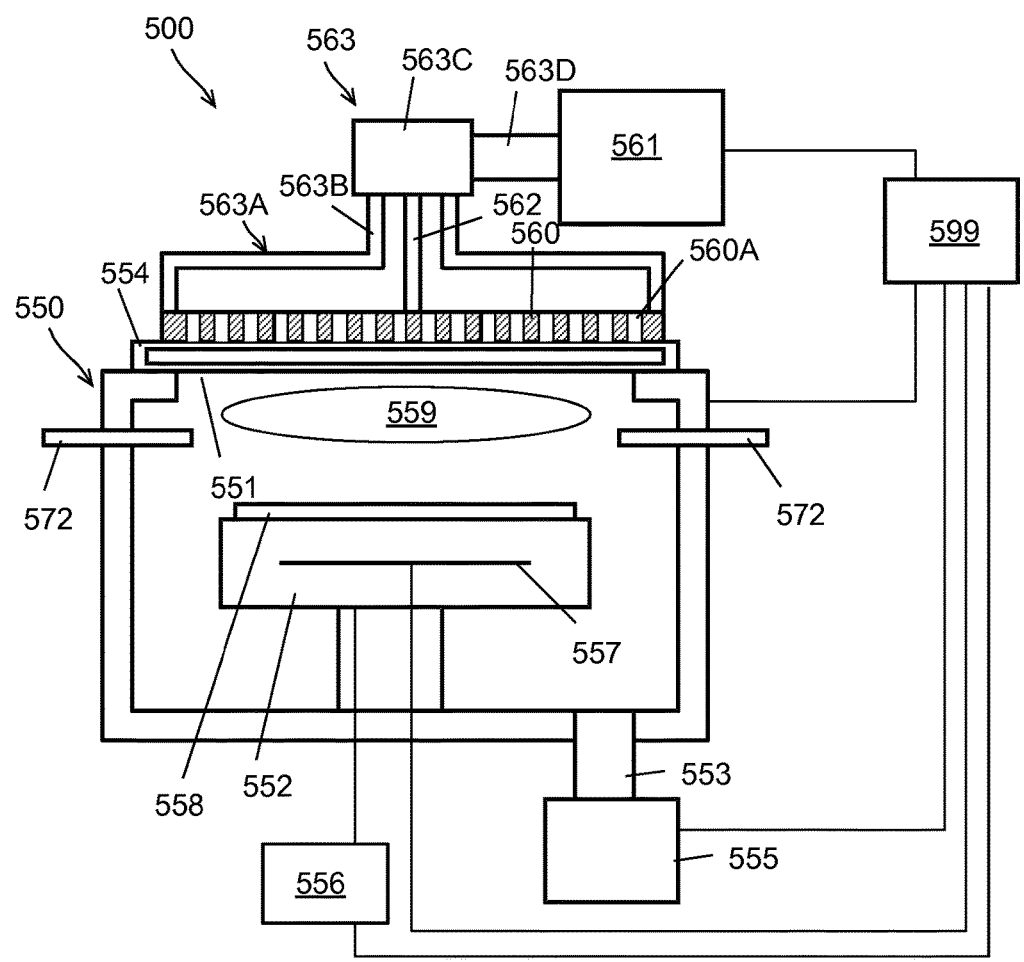
FIG. 10 is a schematic diagram of a plasma processing system containing a RLSA™ plasma for forming a modified interface layer according to one embodiment of the invention.

FIG. 10 is a schematic diagram of a plasma processing system containing a RLSA™ plasma (Tokyo Electron Limited, Akasaka, Japan) for forming a modified interface layer according to one embodiment of the invention. The plasma produced in the plasma processing system 500 is characterized by low electron temperature and high plasma density. The plasma processing system 500 contains a plasma processing chamber 550 having an opening portion 551 in the upper portion of the plasma processing chamber 550 that is larger than a substrate 558. A cylindrical dielectric top plate 554 made of quartz, aluminum nitride, or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 10). Alternatively, a different number of gas lines 572 can be used. The gas lines 572 can be circumferentially arranged in the plasma processing chamber 550, but this is not required for the invention. A process gas can be evenly and uniformly supplied into the plasma region 559 in plasma processing chamber 550 from the gas lines 572.

In the plasma processing system 500, microwave power is provided to the plasma processing chamber 550 through the top plate 554 via a slot antenna 560 having a plurality of slots 560A. The slot antenna 560 faces the substrate 558 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating microwaves with a frequency of about 2.45 GHz, for example. The waveguide 563 contains a flat circular waveguide 563A with a lower end connected to the slot antenna 560, a circular waveguide 563B connected to the upper surface side of the circular waveguide 563A, and a coaxial waveguide converter 563C connected to the upper surface side of the circular waveguide 563B. Furthermore, a rectangular waveguide 563D is connected to the side surface of the coaxial waveguide converter 563C and the microwave power supply 561.

Inside the circular waveguide 563B, an axial portion 562 of an electroconductive material is coaxially provided, so that one end of the axial portion 562 is connected to the central (or nearly central) portion of the upper surface of slot antenna 560, and the other end of the axial portion 562 is connected to the upper surface of the circular waveguide 563B, thereby forming a coaxial structure. As a result, the circular waveguide 563B is constituted so as to function as a coaxial waveguide. The microwave power can, for example, be between about 0.5 W/cm² and about 4 W/cm². Alternatively, the microwave power can be between about 0.5 W/cm² and about 3 W/cm². The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 3.0 and 3.5 eV, between 3.5 eV and 4.0 eV, or between 4.0 and 4.5 eV. The plasma may have a density of about $1 \times 10^{11}$/cm³ to about $1 \times 10^{13}$/cm³, or higher.

In addition, in the plasma processing chamber 550, a substrate holder 552 is provided opposite the top plate 554 for supporting and heating a substrate 558 (e.g., a wafer). The substrate holder 552 contains a heater 557 to heat the substrate 558, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555.

The plasma processing system 500 further contains a substrate bias system 556 configured to bias the substrate holder 552 and the substrate 558 for generating a plasma and/or controlling energy of ions that are drawn to a substrate 558. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0 W and 100 W, between 100 W and 200 W, between 200 W and 300 W, between 300 W and 400 W, or between 400 W and 500 W. In some examples, the RF bias power can be less than 100 W, less than 50 W, or less than 25 W, for example. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. It is noted that one skilled in the art will appreciate that the power levels of the substrate bias system 556 are related to the size of the substrate being processed. For example, a 300 mm Si wafer requires greater power consumption than a 200 mm wafer during processing.

Still referring to FIG. 10, a controller 599 is configured for controlling the plasma processing system 500. The controller 599 can include a microprocessor, a memory, and a digital I/O port capable of generating control voltages sufficient to communicate and activate inputs of the plasma processing system 500 as well as monitor outputs from the plasma processing system 500. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 500 according to a stored process recipe. One example of controller 599 is a UNIX-based workstation. Alternatively, the controller 599 can be implemented as a general-purpose computer, digital signal processing system, etc.

Figure 11:
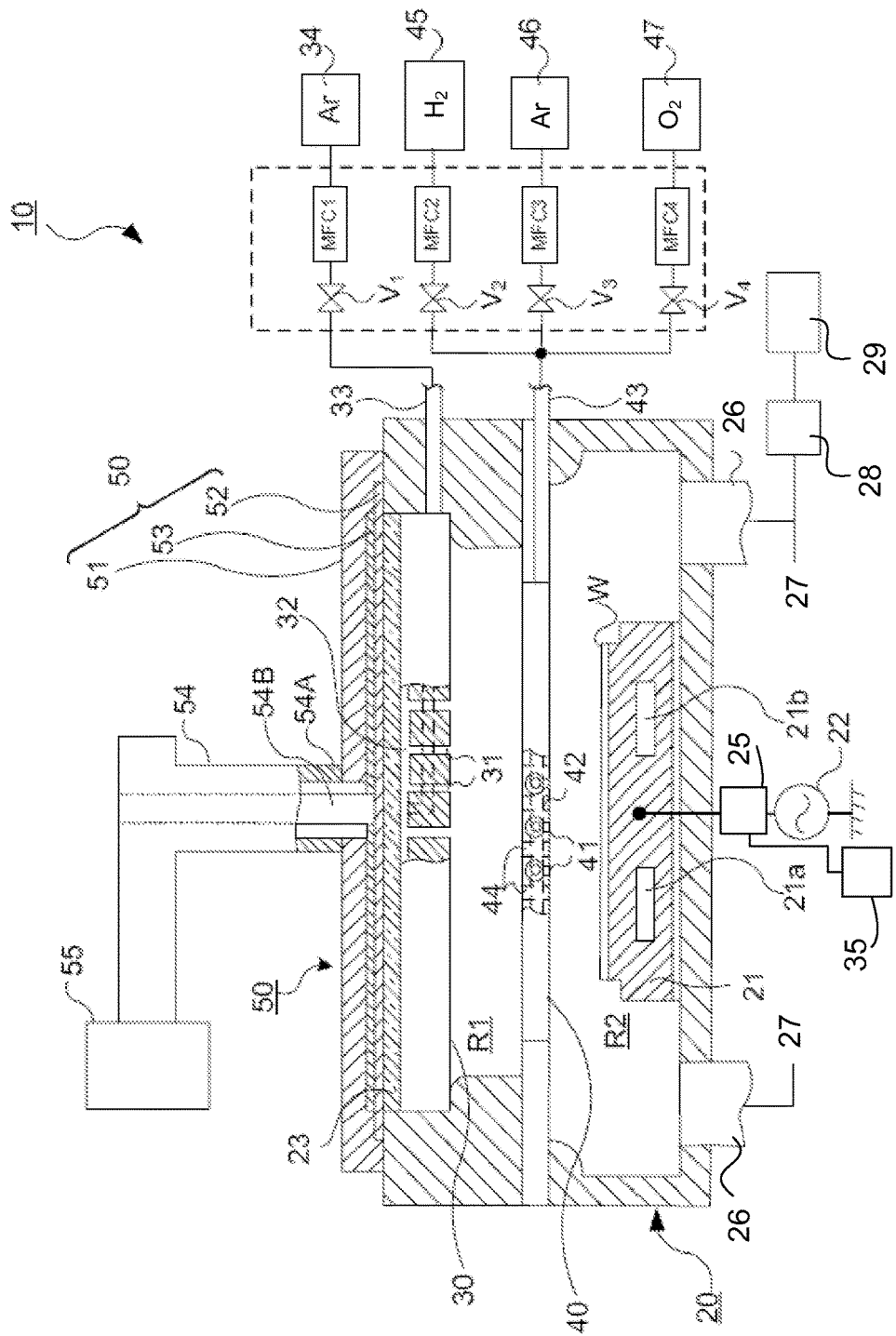
FIG. 11-13 are schematic diagrams of a plasma processing system containing a RLSA™ plasma for forming a modified interface layer according to another embodiment of the invention.

FIG. 11 is a schematic diagram of a plasma processing system containing a RLSA™ plasma (Tokyo Electron Limited, Akasaka, Japan) for forming a modified interface layer according to another embodiment of the invention. As shown in FIG. 11, the plasma processing system 10 includes a plasma processing chamber 20 (vacuum chamber), an antenna unit 50, and a substrate holder 21. Inside of the plasma processing chamber 20 is roughly sectionalized into a plasma generation region R1, located below a plasma gas supply unit 30, and a plasma diffusion region R2 above the substrate holder 21. A plasma generated in the plasma generation region R1 can have an electron temperature of several electron volts (eV). When the plasma is diffused into the plasma diffusion region R2, where the film formation process is performed, the electron temperature of the plasma near the substrate holder 21 may drop to a value of lower than about 2 eV. The substrate holder 21 is located centrally on a bottom portion of the plasma processing chamber 20 and serves as a substrate holder for supporting a substrate W. Inside the substrate holder 21, there is provided an insulating member 21a, a cooling jacket 21b, and a temperature control unit (not shown) for controlling the substrate temperature.

A top portion of the plasma processing chamber 20 is open-ended. The plasma gas supply unit 30 is placed opposite to the substrate holder 21 and is attached to the top portion of the plasma processing chamber 20 via sealing members such as O rings (not shown). The plasma gas supply unit 30, which may also function as a dielectric window, can be made of materials such as aluminum oxide or quartz and has a planar surface. A plurality of gas supply holes 31 are provided opposite the substrate holder 21 on a planar surface of the plasma gas supply unit 30. The plurality of gas supply holes 31 communicate with a plasma gas supply port 33 via a gas flow channel 32. A plasma gas supply source 34 provides a plasma gas, for example argon (Ar) gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is centered in the plasma processing chamber 20 between the plasma generation region R1 and the plasma diffusion region R2. The process gas supply unit 40 may be made of a conducting material, for example an aluminum alloy that includes magnesium (Mg), or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21.

The plasma processing chamber 20 further includes exhaust lines 26 connected to the bottom portion of the plasma processing chamber 20, a vacuum line 27 connecting the exhaust lines 26 to a pressure controller valve 28 and to a vacuum pump 29. The pressure controller valve 28 may be used to achieve a desired gas pressure in the plasma processing chamber 20.

Figure 12:
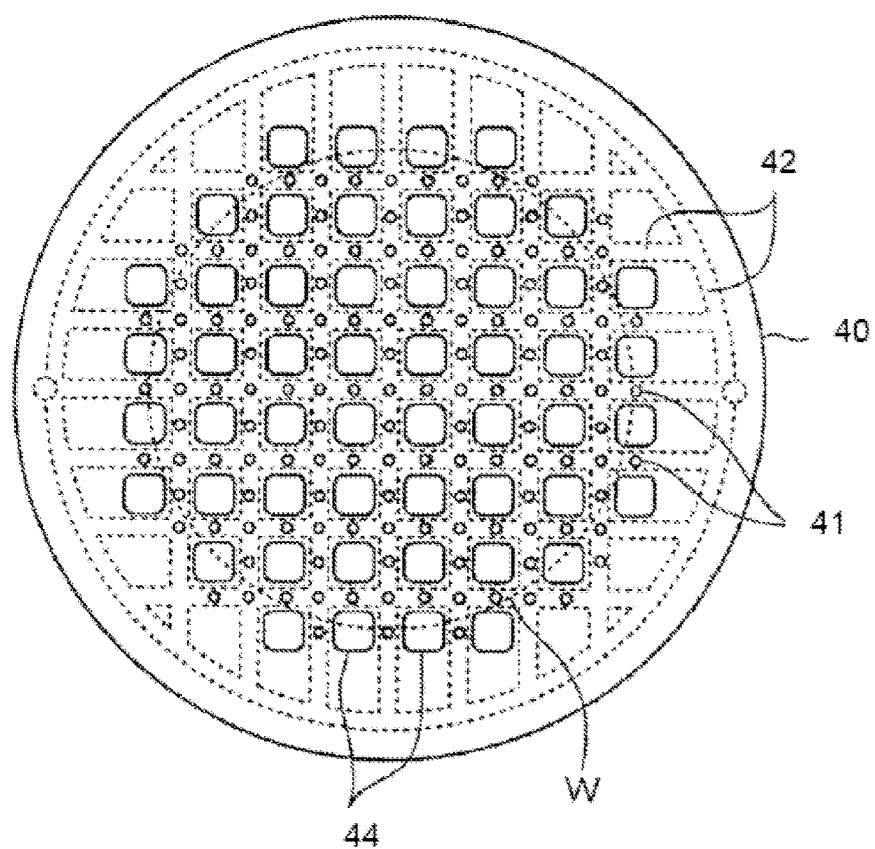

A plan view of the process gas supply unit 40 is shown in FIG. 12. As shown in this figure, grid-like gas flow channels 42 are formed within the process gas supply unit 40. The grid-like gas flow channels 42 communicate with an upper-end of the plurality of gas supply holes 41, which are formed in the vertical direction. The lower portion of the plurality of gas supply holes 41 are openings facing the substrate holder 21. The plurality of gas supply holes 41 communicate with a process gas supply port 43 via the grid-patterned gas flow channels 42.

Further, a plurality of openings 44 are formed in the process gas supply unit 40 such that the plurality of openings 44 pass through the process gas supply unit 40 in the vertical direction. The plurality of openings 44 introduce the plasma gas, e.g., argon (Ar) gas, helium (He) gas, or other inert gases, into the plasma diffusion region R2 above the substrate holder 21. As shown in FIG. 12, the plurality of openings 44 are formed between adjacent gas flow channels 42. The process gas may be supplied from three separate process gas supply sources 45-47 to the process gas supply port 43. The process gas supply sources 45-47 may supply $H_2$ gas, $O_2$ gas, and Ar gas.

The process gas flows through the grid-like gas flow channels 42 and is uniformly supplied into the plasma diffusion region R2 via the plurality of gas supply holes 41. The plasma processing system 10 further includes four valves (V1-V4) and four mass flow rate controller (MFC1-MFC4) for controlling a supply of the process gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30 in the plasma generation region R1, which in turn causes excitation of the process gas within the plasma processing chamber 20.

Figure 13:
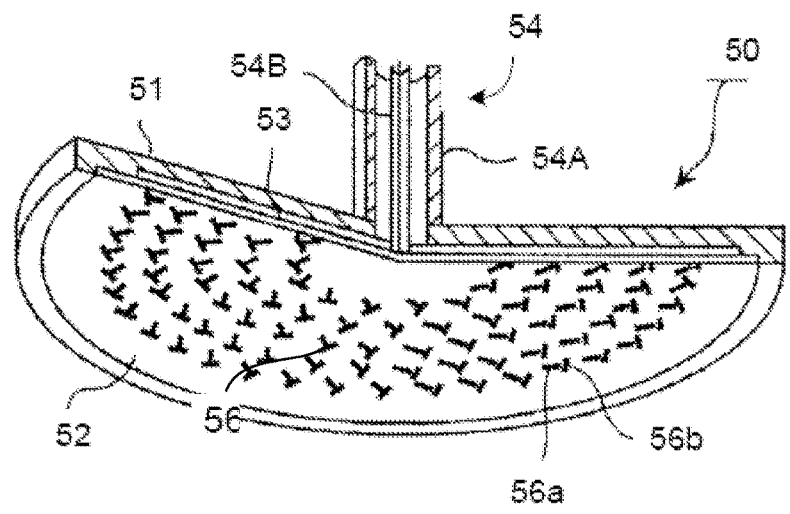

FIG. 13 illustrates a partial cross-sectional view of the antenna unit 50. As shown in this figure, the antenna unit 50 may include a flat antenna main body 51, a radial line slot plate 52, and a dielectric plate 53 to shorten the wavelength of the microwave. The flat antenna main body 51 can have a circular shape with an open-ended bottom surface. The flat antenna main body 51 and the radial line slot plate 52 can be made of a conductive material.

A plurality of slots 56 are provided on the radial line slot plate 52 to generate a circularly polarized wave. The plurality of slots 56 are arranged in a substantially T-shaped form with a small gap between each slot. The plurality of slots 56 are arranged in a concentric circle pattern or a spiral pattern along a circumferential direction. Since the slots 56a and 56b are perpendicular to each other, a circularly polarized wave containing two orthogonal polarized components is radiated, as a plane wave, from the radial line slot plate 52.

The dielectric plate 53 can be made of a low loss dielectric material, e.g., aluminum oxide ($Al_2O_3$) or silicon nitride ($Si_3N_4$), that is located between the radial line slot plate 52 and the flat antenna main body 51. The radial line slot plate 52 may be mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling the energy of ions in the plasma that are drawn to the substrate W. The power supply source 22 is further configured to optionally provide pulsing of the RF bias power. The pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power between 0 W and 100 W, between 100 W and 200 W, between 200 W and 300 W, between 300 W and 400 W, or between 400 W and 500 W. One skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

A plurality of embodiments for forming a semiconductor device have been described. The method uses microwave plasma treatment to enhance high-k film nucleation and electrical mobility in the semiconductor device. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method for forming a semiconductor device, the method comprising:
   providing a substrate in a process chamber;
   flowing a process gas consisting of hydrogen ($H_2$) and optionally a noble gas into the process chamber;
   forming plasma excited species from the process gas by a microwave plasma source;
   exposing an interface layer on the substrate to the plasma excited species to form a modified interface layer; and
   depositing a high dielectric constant (high-k) film by atomic layer deposition (ALD) on the modified interface layer.

2. The method of claim 1, wherein the modified interface layer has higher electrical mobility than the interface layer.

3. The method of claim 1, wherein the high-k film nucleates at a higher rate on the modified interface layer rate than on the interface layer.

4. The method of claim 1, wherein the interface layer includes an oxide layer, an oxynitride layer, or a nitride layer, or a combination thereof.

5. The method of claim 1, wherein exposing the interface layer to the plasma excited species reduces a thickness of the interface layer.

6. The method of claim 1, further comprising
   forming the interface layer on the substrate in the process chamber.

7. The method of claim 6, wherein forming the interface layer comprises
   exposing the substrate to sequential pulses of ozone and water.

8. The method of claim 6, wherein forming the interface layer comprises
   exposing the substrate to plasma exited species formed by microwave plasma excitation of $O_2$ and optionally a noble gas.

9. The method of claim 6, wherein an initial oxide layer is removed from the substrate prior to forming the interface layer on the substrate.

10. The method of claim 9, wherein the initial oxide layer is removed by a chemical oxide removal (COR) process or by exposure to wet dilute hydrofluoric acid (DHF).

11. The method of claim 1, wherein the providing comprises
   providing the substrate in a process chamber, wherein a surface of the substrate is at least substantially free of oxygen; and
   forming the interface layer on the substrate in the process chamber.

12. The method of claim 1, further comprising depositing a metal-containing gate electrode film on the high-k film.

13. The method of claim 12, further comprising
patterning the metal-containing gate electrode film, the high-k film, and the modified interface layer to form a gate stack on the substrate.

14. The method of claim 1, wherein the substrate contains silicon, germanium, silicon germanium, or a compound semiconductor.

15. A method for forming a semiconductor device, the method comprising:
providing a substrate in a process chamber;
flowing a process gas consisting of hydrogen ($H_2$) and optionally a noble gas into the process chamber;
forming plasma excited species from the process gas by a microwave plasma source;
exposing an interface layer on the substrate to the plasma excited species to form a modified interface layer with increased electrical mobility, wherein the exposing reduces a thickness of the interface layer; and
depositing a high dielectric constant (high-k) film by atomic layer deposition (ALD) on the modified interface layer; wherein the high-k film nucleates at a higher rate on the modified interface layer rate than on the interface layer.

16. The method of claim 15, wherein the providing comprises
providing the substrate in a process chamber, wherein a surface of the substrate is at least substantially free of oxygen; and
forming the interface layer on the substrate in the process chamber.

17. A method for forming a semiconductor device, the method comprising:
providing a germanium-containing substrate in a process chamber;
flowing a process gas consisting of hydrogen ($H_2$) and optionally a noble gas into the process chamber;
forming plasma excited species from the process gas by a microwave plasma source;
exposing a germanium-containing interface layer on the substrate to the plasma excited species to form a modified germanium-containing interface layer with increased electrical mobility; and
depositing a high dielectric constant (high-k) film by atomic layer deposition (ALD) on the modified germanium-containing interface layer, wherein the high-k film nucleates at a higher rate on the modified germanium-containing interface layer rate than on the germanium-containing interface layer.

18. The method of claim 17, wherein the germanium-containing substrate includes Ge or SiGe.

19. The method of claim 17, wherein the germanium-containing interface layer includes germanium oxide.

20. The method of claim 17, wherein exposing the germanium-containing interface layer to the plasma excited species reduces a thickness of the germanium-containing interface layer.

* * * * *

UNITED STATES PATENT AND TRADEMARK OFFICE
CERTIFICATE OF CORRECTION

PATENT NO. : 10,522,343 B2
APPLICATION NO. : 14/635806
DATED : December 31, 2019
INVENTOR(S) : Kandabara N. Tapily et al.

It is certified that error appears in the above-identified patent and that said Letters Patent is hereby corrected as shown below:

On the Title Page

Column 2, Abstract, last 3 lines, change "mobility than the interface layer, and the high-k film nucleates at a higher rate on the modified interface layer rate than on the interface layer." to --mobility than the interface layer, and the high-k film nucleates at a higher rate on the modified interface layer than on the interface layer.--.

In the Specification

Column 2, Lines 1-2, change "layer, where the high-k film nucleates at a higher rate on the modified interface layer rate than on the interface layer." to --layer, where the high-k film nucleates at a higher rate on the modified interface layer than on the interface layer.--.

Column 2, Lines 14-16, change "nucleates at a higher rate on the modified germanium-containing interface layer rate than on the germanium-containing interface layer." to --nucleates at a higher rate on the modified germanium-containing interface layer than on the germanium-containing interface layer.--.

Column 2, Line 49, change "FIG. 11-13 are schematic diagrams of" to --FIGS. 11-13 are schematic diagrams of--.

Column 3, Lines 52-54, change "between about 300°C. and about 500°C., between about 20°C. and about 500°C., or between about 200°C.and about 300°C." to --between about 300°C. and about 500°C., between about 200°C. and about 500°C., or between about 200°C. and about 300°C.--.

Column 4, Lines 55-57, change "between about 300°C. and about 500°C., between about 20°C. and about 500°C., or between about 200°C. and about 300°C." to --between about 300°C. and about 500°C., between about 200°C. and about 500°C., or between about 200°C. and about 300°C.--.

Signed and Sealed this
Thirty-first Day of March, 2020

Andrei Iancu
*Director of the United States Patent and Trademark Office*

CERTIFICATE OF CORRECTION (continued)
U.S. Pat. No. 10,522,343 B2

Column 7, Lines 17-18, change "since the excited $H_2$ species are thought increase the" to --since the excited $H_2$ species are thought to increase the--.

Column 9, Lines 11-12, change "The substrate bias system 556 includes a substrate power source configured couple power to the substrate" to --The substrate bias system 556 includes a substrate power source configured to couple power to the substrate--.

Column 9, Lines 23-25, change "The substrate bias system 556 is configured for supplying RF bias power can be between 0 W and 100W," to --The substrate bias system 556 is configured for supplying RF bias power that can be between 0 W and 100 W,--.

Column 11, Lines 9-10, change "valves (V1-V4) and four mass flow rate controller (MFC1-MFC4) for controlling" to --valves (V1-V4) and four mass flow rate controllers (MFC1-MFC4) for controlling--.

In the Claims

Column 12, Lines 31-33, Claim 3, change "The method of claim 1, wherein the high-k film nucleates at a higher rate on the modified interface layer rate than on the interface layer." to --The method of claim 1, wherein the high-k film nucleates at a higher rate on the modified interface layer than on the interface layer.--.

Column 13, Lines 19-22, Claim 15, change "depositing a high dielectric constant (high-k) film by atomic layer deposition (ALD) on the modified interface layer; wherein the high-k film nucleates at a higher rate on the modified interface layer rate than on the interface layer." to --depositing a high dielectric constant (high-k) film by atomic layer deposition (ALD) on the modified interface layer; wherein the high-k film nucleates at a higher rate on the modified interface layer than on the interface layer.--.

Column 14, Lines 18-19, Claim 17, change "film nucleates at a higher rate on the modified germanium-containing interface layer rate than on the" to --film nucleates at a higher rate on the modified germanium-containing interface layer than on the--.